United States Patent
Matsuo et al.

(10) Patent No.: US 10,461,466 B2
(45) Date of Patent: Oct. 29, 2019

(54) CONNECTOR ASSEMBLY

(71) Applicant: JAPAN AVIATION ELECTRONICS INDUSTRY, LIMITED, Tokyo (JP)

(72) Inventors: Kosuke Matsuo, Tokyo (JP); Atsushi Kira, Tokyo (JP); Shinichiro Nakajima, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 15/622,547

(22) Filed: Jun. 14, 2017

(65) Prior Publication Data

US 2018/0062310 A1 Mar. 1, 2018

(30) Foreign Application Priority Data

Aug. 25, 2016 (JP) .................................. 2016-164275

(51) Int. Cl.
*H01R 13/52* (2006.01)
*H01R 13/627* (2006.01)
(Continued)

(52) U.S. Cl.
CPC ......... *H01R 13/6271* (2013.01); *H01R 12/78* (2013.01); *H01R 13/2407* (2013.01);
(Continued)

(58) Field of Classification Search
CPC ........ H01R 23/27; H01R 12/00; H01R 13/28; H01R 13/46; H01R 13/64; H01R 13/2407;
(Continued)

(56) References Cited

U.S. PATENT DOCUMENTS 4,639,061 A * 1/1987 Muzslay ............ H01R 13/5221
439/281
5,511,518 A * 4/1996 Jain .................... F01M 11/0004
123/195 C
(Continued)

FOREIGN PATENT DOCUMENTS

CA 2814206 A1 4/2012
CN 101273494 A 9/2008
(Continued)

OTHER PUBLICATIONS

Office Action issued in EP family member Patent Appl. No. 17182395.8, dated Jan. 19, 2018.
(Continued)

*Primary Examiner* — Amy Cohen Johnson
*Assistant Examiner* — Milagros Jeancharles
(74) *Attorney, Agent, or Firm* — Greenblum & Bernstein, P.L.C.

(57) ABSTRACT

A connector assembly includes a first connector that has first electrical connection members arranged on a base material made of resin and a second connector that has second electrical connection members on positions respectively opposed to the first electrical connection members on a base material made of resin. The first connector and the second connector further have fasteners, which are made of resin and are engageable, on mutually-opposed positions, and may have seal members or water repellent treatment members. In a case where seal members and water repellent treatment members are not provided, the fasteners form a polygonal shape surrounding the first electrical connection members or the second electrical connection members, and in a case where seal members or water repellent treatment members are provided, the fasteners and the seal members or the water repellent treatment members surround the first
(Continued)

electrical connection members or the second electrical connection members.

20 Claims, 16 Drawing Sheets

(51) Int. Cl.
    *H01R 13/24*     (2006.01)
    *H01R 13/405*     (2006.01)
    *H01R 12/78*     (2011.01)
    *H01R 12/71*     (2011.01)
    *H05K 3/36*     (2006.01)

(52) U.S. Cl.
    CPC ....... *H01R 13/2414* (2013.01); *H01R 13/405* (2013.01); *H01R 13/5219* (2013.01); *H01R 13/627* (2013.01); *H01R 12/714* (2013.01); *H01R 13/52* (2013.01); *H05K 3/365* (2013.01); *H05K 3/368* (2013.01)

(58) Field of Classification Search
    CPC ............ H01R 13/2405; H01R 13/6271; H01R 13/5219; H01R 13/405; H01R 13/40; H01R 13/41; H01R 13/42; H01R 13/422; H01R 13/504; H01R 13/518; H01R 13/516; H01R 13/514; H01R 13/506
    USPC ..... 439/39, 66, 91, 271–273, 278, 282, 293, 439/355, 587, 591, 289, 290
    See application file for complete search history.

(56) References Cited

U.S. PATENT DOCUMENTS

| | | | | |
|---|---|---|---|---|
| 5,888,101 | A * | 3/1999 | Dent | H01R 13/631 439/378 |
| 5,904,581 | A * | 5/1999 | Pope | H01R 12/716 439/74 |
| 6,540,529 | B1 * | 4/2003 | Yu | H01R 24/84 439/74 |
| 6,575,764 | B1 * | 6/2003 | Reipur | H01R 13/24 439/289 |
| 6,780,022 | B1 | 8/2004 | Fan et al. | |
| 7,364,433 | B2 * | 4/2008 | Neidlein | H01R 13/24 439/39 |
| 7,789,696 | B2 * | 9/2010 | Umei | H05K 5/0247 439/447 |
| 7,828,302 | B2 * | 11/2010 | Hurlbert | F16J 15/125 277/637 |
| 7,857,647 | B2 * | 12/2010 | Bracci | H01R 13/5205 439/274 |
| 8,147,268 | B2 * | 4/2012 | Shuey | H01R 24/84 439/371 |
| 8,393,466 | B2 * | 3/2013 | Rayner | G06F 1/1626 206/320 |
| 8,845,351 | B2 * | 9/2014 | Johnson | H01R 13/405 439/284 |
| 8,973,753 | B2 * | 3/2015 | Rayner | G06F 1/1626 206/320 |
| 9,565,782 | B2 * | 2/2017 | Alexander | H05K 7/1455 |
| 9,755,337 | B2 * | 9/2017 | Brzezinski | H01R 12/73 |
| 10,003,145 | B1 * | 6/2018 | Annis | H01R 12/716 |
| 10,199,770 | B2 * | 2/2019 | Komoto | H01R 12/69 |
| 10,314,175 | B2 * | 6/2019 | Sato | C09D 11/38 |
| 2006/0137150 | A1 | 6/2006 | Ishizaki et al. | |
| 2009/0233465 | A1 | 9/2009 | Mizoguchi | |
| 2011/0206340 | A1 * | 8/2011 | Kobayashi | G02B 6/4471 385/137 |
| 2012/0258626 | A1 | 10/2012 | Johnson et al. | |
| 2012/0258633 | A1 | 10/2012 | Johnson et al. | |
| 2013/0279183 | A1 | 10/2013 | Yoshida | |
| 2013/0335898 | A1 * | 12/2013 | Stevens | H05K 13/00 361/679.01 |
| 2014/0178126 | A1 * | 6/2014 | Burns | F16B 7/182 403/343 |
| 2016/0190719 | A1 | 6/2016 | Brzezinski et al. | |
| 2019/0098778 | A1 * | 3/2019 | Pandey | H01R 12/7082 |

FOREIGN PATENT DOCUMENTS

| | | |
|---|---|---|
| CN | 102110936 A | 6/2011 |
| CN | 202585882 U | 12/2012 |
| CN | 103210221 A | 7/2013 |
| CN | 103299121 A | 9/2013 |
| CN | 104364020 A | 2/2015 |
| EP | 1189309 A1 | 3/2002 |
| JP | H11144830 A | 5/1999 |
| JP | 2004-241187 | 8/2004 |
| JP | 2005082431 A | 3/2005 |
| JP | 2005-225516 | 8/2005 |
| JP | 2006-055280 | 3/2006 |
| JP | 2015-082431 | 4/2015 |
| JP | 2015-135723 | 7/2015 |
| KR | 10-2008-0044800 | 5/2008 |
| KR | 10-1399070 | 5/2014 |

OTHER PUBLICATIONS

Office Action issued in EP Counterpart Patent Appl. No. 17182395.8, dated Oct. 16, 2018.
Office Action issued in China Counterpart Patent Appl. No. 201710585087.7, dated Dec. 26, 2018, along with an english translation thereof.
Office Action issued in China Counterpart Patent Appl. No. 201710585087.7, dated Jul. 16, 2019, along with an English translation thereof.
Office Action issued in Korea Counterpart Patent Appl. No. 10-2017-0079649, dated Jun. 1, 2018, along with an english translation thereof.

\* cited by examiner

CONNECTOR ASSEMBLY

CROSS REFERENCE TO RELATED APPLICATION

This application is based on Japanese Patent Application No. 2016-164275 filed in Japanese Patent Office on Aug. 25, 2016, contents of which are hereby incorporated by reference.

TECHNICAL FIELD

The present invention relates to a connector assembly for taking out an electric signal from a device which is attached to clothes, a body, or the like.

BACKGROUND ART

As a connector for taking out an electric signal from a device which is attached to clothes, a body, or the like, the technique of Japanese Patent Application Laid Open No. 2015-135723 (hereinafter referred to as "Patent Literature 1") and the like are known. FIG. 1 shows FIG. 2 of Patent Literature 1. In the abstract of Patent Literature 1, there is a description: "To provide a connector capable of preventing the feeling of fitness and durability from being damaged." as problem to be solved, and there is a description: "A snap button connector includes a first cloth 1 having conductivity, a second cloth 2 having conductivity, and a snap button 3 for connecting the other ends of the first cloth 1 and second cloth 2 so that they can be detached mechanically and electrically. The snap button 3 is constituted of a male snap button 4 connected mechanically and electrically with the first cloth 1, and composed of a conductive material, and a female snap button 5 connected mechanically and electrically with the second cloth 2, and composed of a conductive material." as solution. Further, as the related art of a fastener made of resin, there are the techniques of Japanese Patent Application Laid Open No. 2005-225516 (hereinafter referred to as "Patent Literature 2") and Japanese Patent Application Laid Open No. 2006-55280 (hereinafter referred to as "Patent Literature 3"), for example.

SUMMARY OF THE INVENTION

However, even though the technique of Patent Literature 1 relates to a connector for wearable device which is attached to clothes, a body, or the like, an electrical connection member does not have a drip-proof structure (a structure for preventing adhesion of water drops). Therefore, the technique of Patent Literature 1 has a problem that the electrical connection member is easily deteriorated due to water drops or the like adhering in a living environment.

An object of the present invention is to provide a connector assembly having waterproofness in a living environment.

A connector assembly according to the present invention includes a first connector that has first electrical connection members arranged on a base material made of resin, and a second connector that has second electrical connection members on positions respectively opposed to the first electrical connection members on a base material made of resin. The first connector and the second connector further have fasteners which are made of resin, are engageable, and are integrated with respectively-corresponding base materials, on mutually-opposed positions. Further, the first connector and the second connector may have seal portions made of seal members or water repellent treatment portions made of members subjected to water repellent treatment on mutually-opposed positions, as well.

In a case where the first connector and the second connector do not have seal portions and water repellent treatment portions, the fasteners of the first connector form a polygonal shape surrounding the first electrical connection members. In a case where the first connector and the second connector have seal portions or water repellent treatment portions, the fasteners and the seal portions or the water repellent treatment portions of the first connector surround the first electrical connection members. In a case where the first connector and the second connector do not have seal portions and water repellent treatment portions, the fasteners of the second connector form a polygonal shape surrounding the second electrical connection members. In a case where the first connector and the second connector have seal portions or water repellent treatment portions, the fasteners and the seal portions or the water repellent treatment portions of the second connector surround the second electrical connection members. The fasteners have water-tightness when the fasteners are engaged with each other. The first electrical connection members and the second electrical connection members are respectively brought into contact with each other by engaging the fasteners which are respectively opposed to each other.

According to the connector assembly of the present invention, positioning and fixing can be performed with the fasteners, facilitating attachment and detachment. Further, the fasteners have water-tightness, so that infiltration of water drops from a gap between the fasteners is limited. Thus, waterproofness in a living environment or in the similar environment can be secured.

DETAILED DESCRIPTION OF THE EMBODIMENTS

Figure 1:
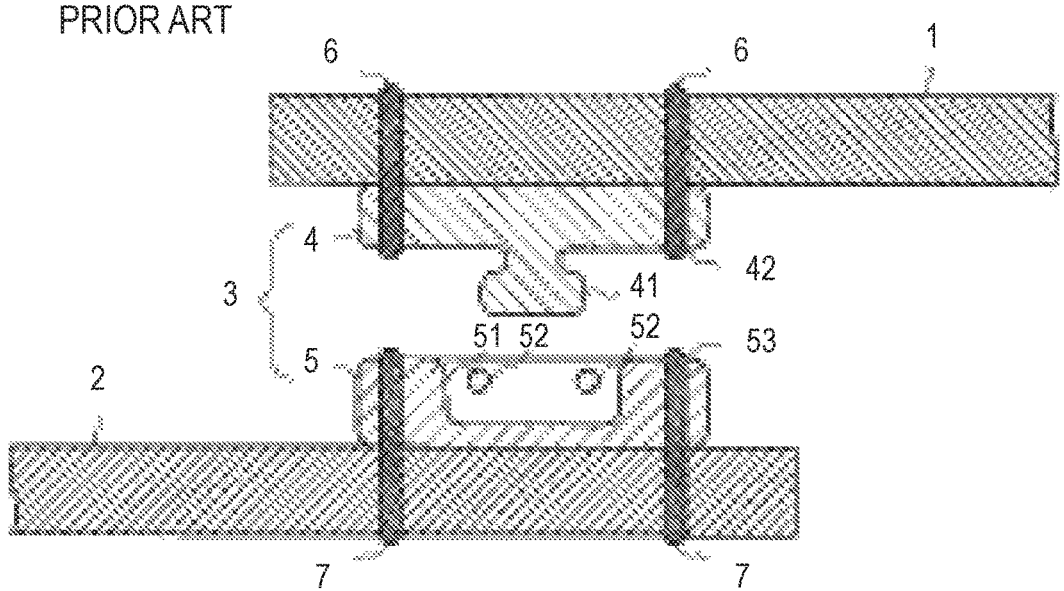
FIG. 1 is a diagram showing FIG. 2 of Patent Literature 1.

Embodiments of the present invention will be described in detail below. Components having the same functions as each other will be denoted with the same reference numerals and duplicate description thereof will be omitted.

First Embodiment

Figure 2:
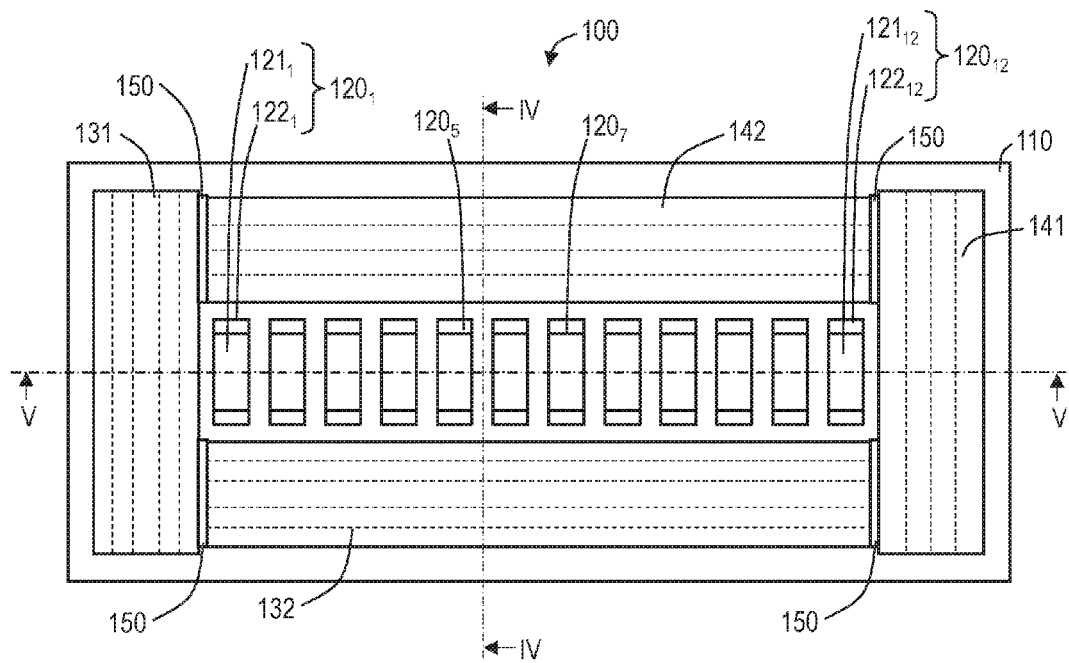
FIG. 2 is a planar view illustrating a first connector of a connector assembly according to a first embodiment.
Figure 3:
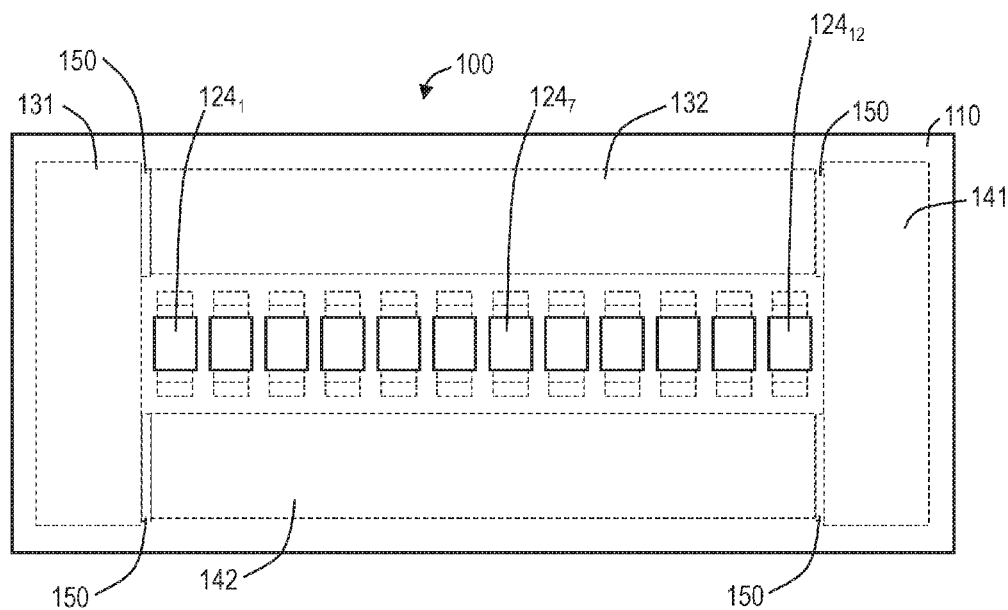
FIG. 3 is a rear view illustrating the first connector of the connector assembly according to the first embodiment.
Figure 4:
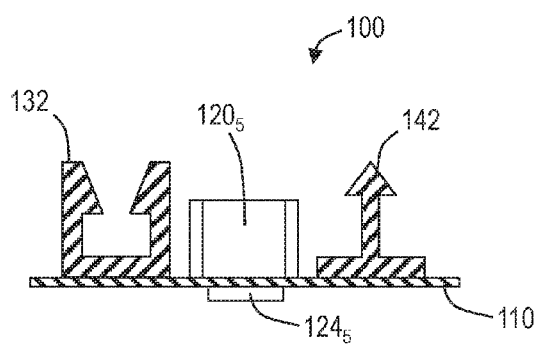
FIG. 4 is a sectional view taken along the line IV-IV of FIG. 2.
Figure 5:
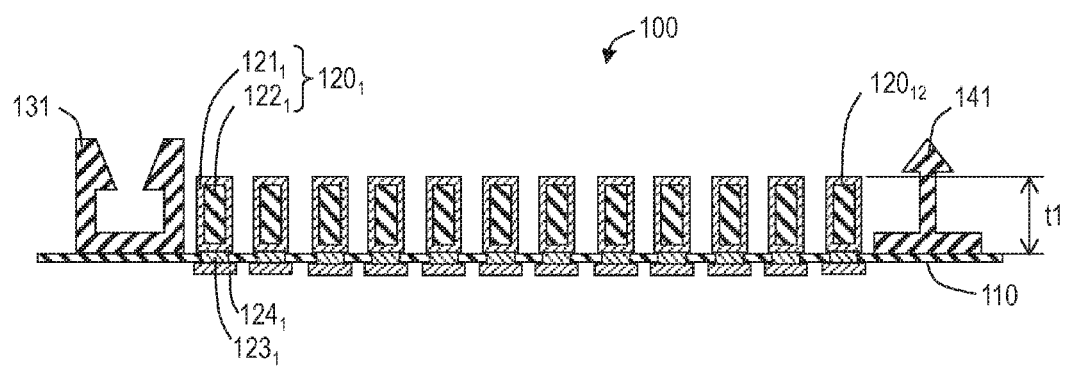
FIG. 5 is a sectional view taken along the line V-V of FIG. 2.
Figure 6:
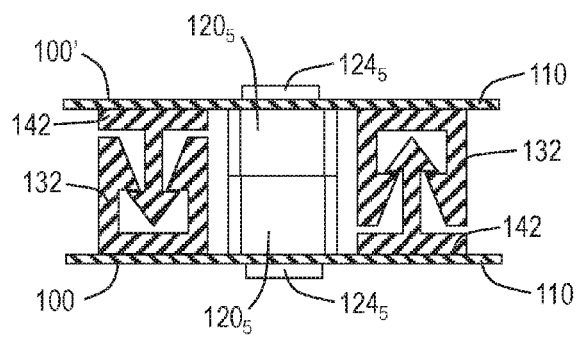
FIG. 6 is a sectional view on the IV-IV position of FIG. 2 in a case where fasteners of the first connector and fasteners of a second connector, which are respectively opposed to each other, of the connector assembly according to the first embodiment are respectively engaged with each other.
Figure 7:
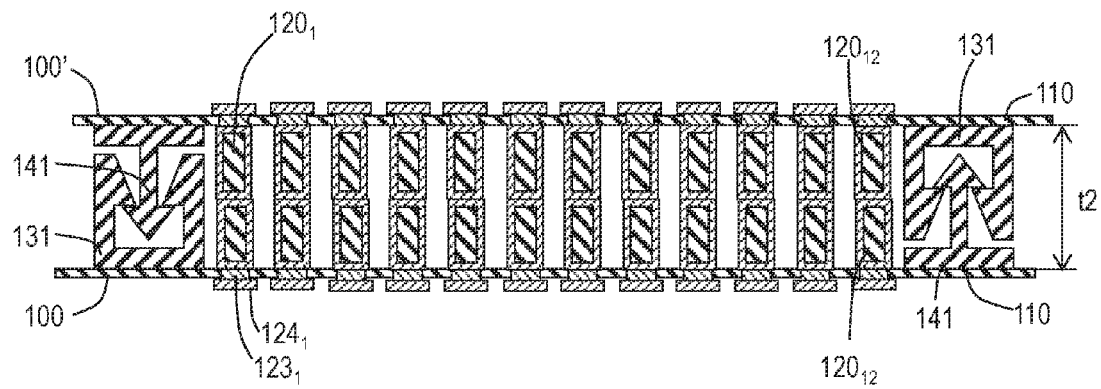
FIG. 7 is a sectional view on the V-V position of FIG. 2 in a case where the fasteners of the first connector and the fasteners of the second connector, which are respectively opposed to each other, of the connector assembly according to the first embodiment are respectively engaged with each other.
Figure 8:
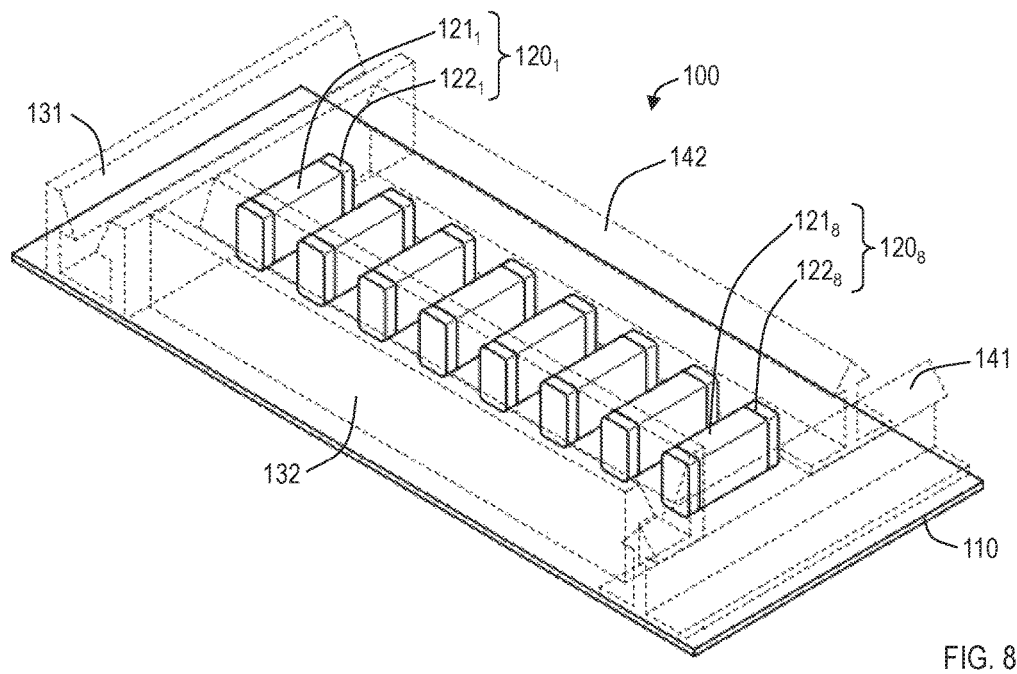
FIG. 8 is a perspective view illustrating the first connector of the connector assembly according to the first embodiment.
Figure 9:
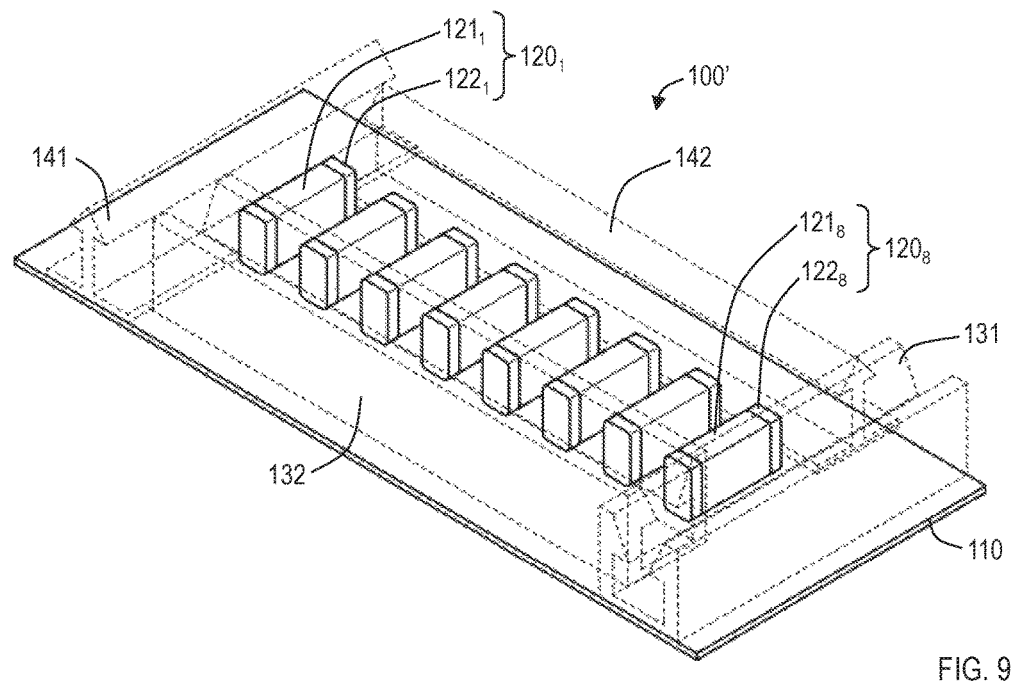
FIG. 9 is a perspective view illustrating the second connector of the connector assembly according to the first embodiment.

FIG. 2 is a planar view illustrating a first connector of a connector assembly according to a first embodiment. FIG. 3 is a rear view illustrating the first connector of the connector assembly according to the first embodiment. FIG. 4 is a sectional view taken along the line IV-IV of FIG. 2. FIG. 5 is a sectional view taken along the line V-V of FIG. 2. FIG. 6 is a sectional view on the IV-IV position of FIG. 2 in a case where fasteners of the first connector and fasteners of a second connector, which are respectively opposed to each other, of the connector assembly according to the first embodiment are respectively engaged with each other (the first connector is illustrated on the lower side). FIG. 7 is a sectional view on the V-V position of FIG. 2 in a case where the fasteners of the first connector and the fasteners of the second connector, which are respectively opposed to each other, of the connector assembly according to the first embodiment are respectively engaged with each other (the first connector is illustrated on the lower side). FIG. 8 is a perspective view illustrating the first connector of the connector assembly according to the first embodiment. FIG. 9 is a perspective view illustrating the second connector of the connector assembly according to the first embodiment. In FIG. 8 and FIG. 9, fasteners 131, 132, 141, and 142 are drawn by dotted lines so as to facilitate understanding of the whole shape and accordingly, parts actually concealed by the fasteners 131, 132, 141, and 142 are also illustrated. As illustrated in FIG. 8 and FIG. 9, arrangement on a first connector 100 and arrangement on a second connector 100' in the first embodiment are the same as each other except for the fasteners 131 and the fasteners 141 which are respectively arranged on inverted positions. Further, FIGS. 2 to 7 illustrate an example in which twelve pieces of first electrical connection members are provided, while FIG. 8 illustrates an example in which eight pieces of first electrical connection members are provided. In FIG. 9, the second connector which is connected with the first connector of FIG. 8 is illustrated and includes eight pieces of second electrical connection members. Thus, the number of the first electrical connection members and the number of the second electrical connection members do not have to be limited and may be determined in accordance with the application.

The connector assembly according to the first embodiment includes the first connector 100 which has first electrical connection members $120_1, \ldots, 120_{12}$ arranged on a base material 110 made of resin and the second connector 100' which has second electrical connection members $120_1, \ldots, 120_{12}$ on positions respectively opposed to the first electrical connection members $120_1, \ldots, 120_{12}$ on a base material 110 made of resin. The first connector 100 and the second connector 100' further include the fasteners 131, 132, 141, and 142 which are made of resin, are engageable, and are integrated with respectively-corresponding base materials 110, on mutually-opposed positions. The fasteners 131, 132, 141, and 142 of the first connector 100 form a polygonal shape which surrounds the first electrical connection members $120_1, \ldots, 120_{12}$ and the fasteners 131, 132, 141, and 142 of the second connector 100' form a polygonal shape which surrounds the second electrical connection members $120_1, \ldots, 120_{12}$. The fasteners 131, 132, 141, and 142 have water-tightness when they are engaged with corresponding fasteners. That is, water cannot infiltrate from parts on which the fasteners 131, 132, 141, and 142 are engaged with corresponding fasteners. By engaging the fasteners 131, 132, 141, and 142 of the first connector 100 and the fasteners 141, 142, 131, and 132 of the second connector 100' which are respectively opposed to each other, the first electrical connection members $120_1, \ldots, 120_{12}$ and the second electrical connection members $120_1, \ldots, 120_{12}$ are respectively brought into contact with each other. FIGS. 2 to 9 illustrate a case where the fasteners form a rectangular shape. However, the fasteners may form another polygonal shape such as a hexagonal shape. Further, in FIGS. 2 to 9, both of inner sides of the fasteners (sides closer to the first electrical connection members $120_1, \ldots, 120_{12}$) and outer sides form rectangular shapes. However, in a case where the fasteners form another polygonal shape, it is sufficient that the inner sides of the fasteners form the polygonal shape, and the outer sides of the fasteners do not have to be brought into contact with each other.

When the base material 110 is composed of a high density polyethylene film having the thickness of 50 to 100 μm, for example, the base material 110 exhibits flexibility. Further, a fastener described in Patent Literature 2, for example, may be employed as the fasteners 131, 132, 141, and 142. The fasteners 131, 132, 141, and 142 may be made with low density polyethylene and formed in a strip-like shape to be integrated with the base material 110. Through such formation, the fasteners 131, 132, 141, and 142 can obtain water-tightness in engagement thereof. "Integration" represents a state of adhesion through thermal fusion or with an adhesive, for example. The fasteners 131, 132, 141, and 142 may be formed to have the height of approximately 1.5 mm and the width of approximately 1.5 mm. The length of the fasteners 131, 132, 141, and 142 may be determined in accordance with the number or the size of the first electrical connection members. Further, in a case where gaps among the fasteners 131, 132, 141, and 142 have a width unignorable with respect to required waterproofness, seal members 150 may be provided in the gaps among the fasteners 131, 132, 141, and 142. In this case, the seal members 150, which are opposed to each other, of the first connector 100 and the second connector 100' are brought into contact with each other when the fasteners 131, 132, 141, and 142 of the first connector 100 and the fasteners 141, 142, 131, and 132 of the second connector 100' are engaged with each other. Accordingly, the waterproofness can be enhanced. Here, in a case where gaps among the fasteners 131, 132, 141, and 142 have a width ignorable with respect to required waterproofness, the seal member 150 does not have to be provided. Further, the waterproofness may be enhanced by applying water repellent treatment to gap parts among the fasteners 131, 132, 141, and 142. Further, the fasteners 131, 132, 141, and 142 not only secure the waterproofness but also have a role for positioning.

The first electrical connection members $120_1, \ldots, 120_{12}$ and the second electrical connection members $120_1, \ldots, 120_{12}$ have the configurations in which conductors $121_1, \ldots, 121_{12}$ are bonded around elastic members $122_1, \ldots, 122_{12}$ respectively. Examples of a material of the elastic members $122_1, \ldots, 122_{12}$ include elastomer, polyurethane, polyester, polyamide, polystyrene, polyolefin, vinyl chloride, styrene-butadiene rubber, chloroprene rubber, and ethylene-propylene rubber. However, the material is not limited to these. The conductors $121_1, \ldots, 121_{12}$ may be made of a copper film, for example.

Through holes are formed on the base material 110 so as to secure conductivity between an upper face and a rear face of the base material 110. Through conductive portions $123_1, \ldots, 123_{12}$ are respectively arranged so as to fill the through holes and be connected with the conductors $121_1, \ldots, 121_{12}$. Further, conductors $124_1, \ldots, 124_{12}$ are arranged on positions, on which the conductors $124_1, \ldots, 124_{12}$ are respectively connected with the through conductive portions $123_1, \ldots, 123_{12}$, on the rear face of the base material 110. Here, a conductive adhesive may be used as a material of the through conductive portions $123_1, \ldots, 123_{12}$. Further, the conductors $124_1, \ldots, 124_{12}$ may be made of a copper film.

For example, the height (t1 in FIG. 5), the width (the longer direction in the planar view of FIG. 2), and the thickness (the shorter direction in the planar view of FIG. 2) of the first electrical connection members $120_1, \ldots, 120_{12}$ may be respectively set to approximately 0.9 mm, approximately 3 mm, and approximately 1 mm, and the interval among the first electrical connection members $120_1, \ldots, 120_{12}$ may be set to approximately 1 mm. The same goes for the second electrical connection members $120_1, \ldots, 120_{12}$. An interval (t2 in FIG. 7) between the base materials 110 in a state that the fasteners 131, 132, 141, and 142 are respectively engaged with corresponding fasteners may be set to approximately 1.7 mm. In the state of engagement, the elastic members $122_1, \ldots, 122_{12}$ deform and thus the first electrical connection members $120_1, \ldots, 120_{12}$ and the second electrical connection members $120_1, 120_{12}$ are in contact with each other in a manner to push against each other. A relationship between t1 and t2 may be set as appropriate based on a mutual pushing force required in engagement, an elastic modulus of the elastic members $122_1, \ldots, 122_{12}$, and the like. That is, the first electrical connection members $120_1, \ldots, 120_{12}$ and the second electrical connection members $120_1, \ldots, 120_{12}$ have elasticity in a normal direction of the base material 110.

According to the connector assembly of the first embodiment, when the fasteners are engaged with each other, the first electrical connection members and the second electrical connection members are brought into contact with each other in a manner to push against each other. Further, positioning and fixing can be performed with the fasteners, facilitating attachment and detachment. Furthermore, the fasteners have water-tightness, so that infiltration of water drops from a gap between the fasteners is limited. Thus, waterproofness in a living environment or in a similar environment can be secured.

Second Embodiment

Figure 10:
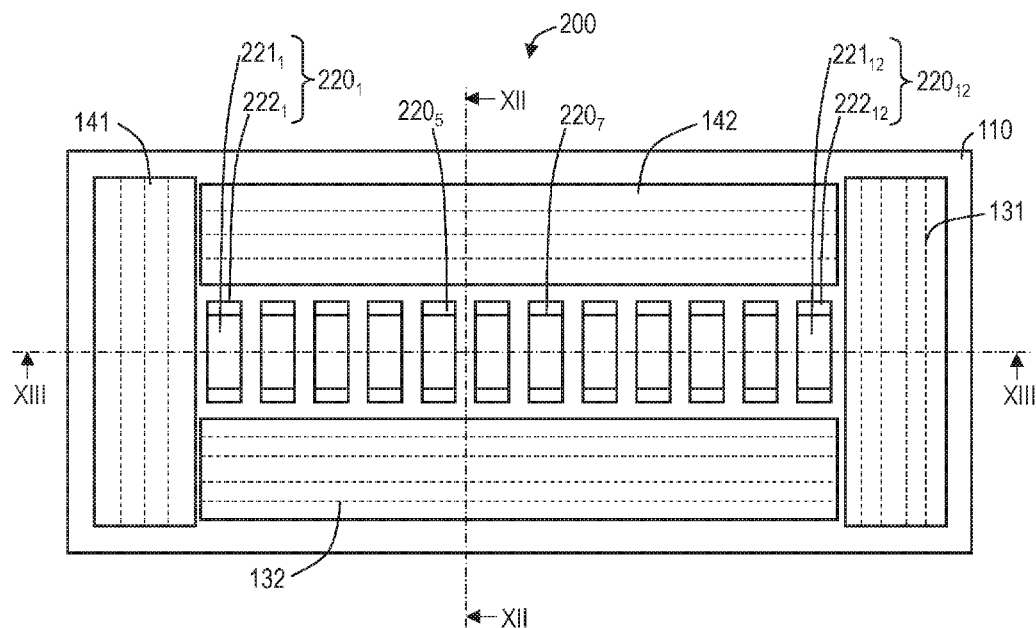
FIG. 10 is a planar view illustrating a first connector of a connector assembly according to the second embodiment.
Figure 11:
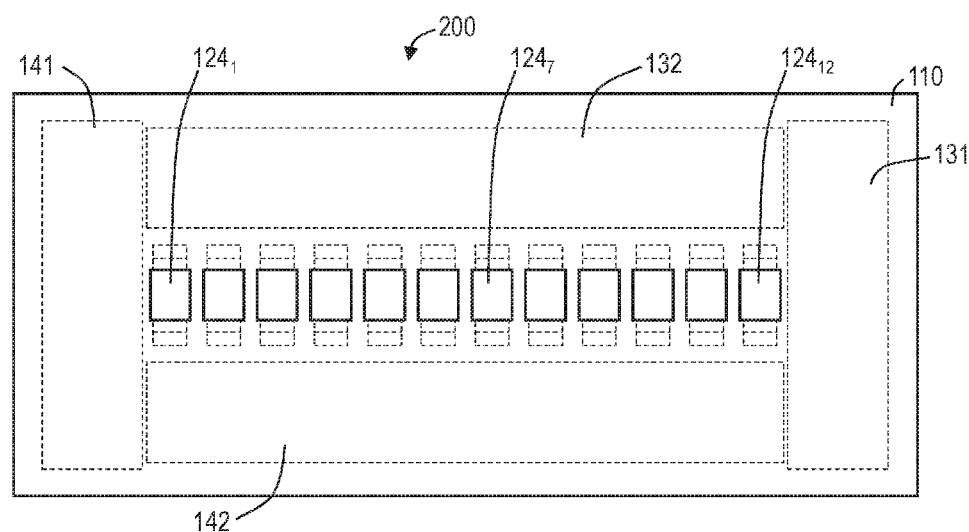
FIG. 11 is a rear view illustrating the first connector of the connector assembly according to the second embodiment.
Figure 12:
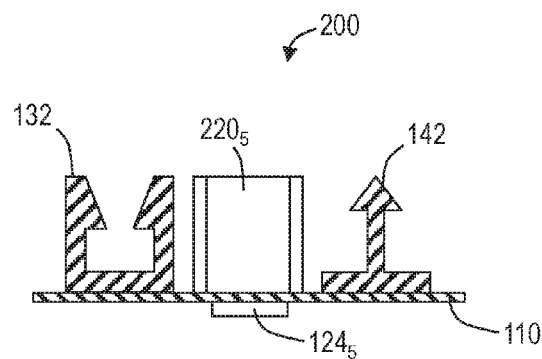
FIG. 12 is a sectional view taken along the line XII-XII of FIG. 10.
Figure 13:
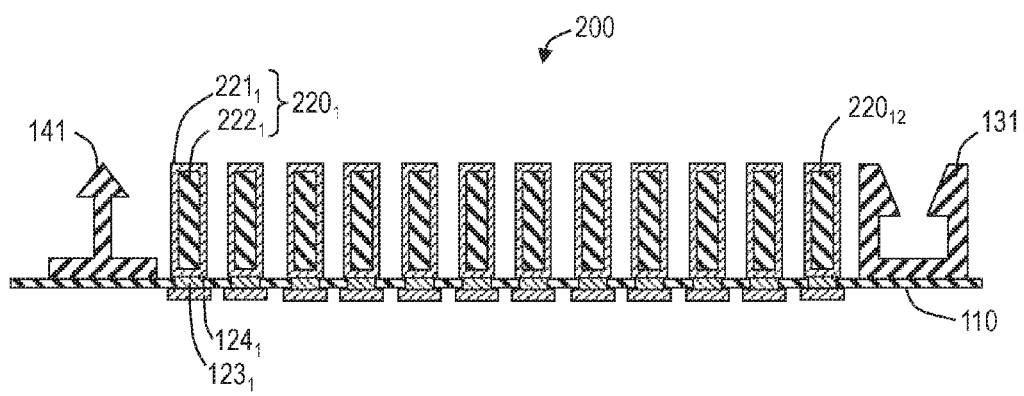
FIG. 13 is a sectional view taken along the line XIII-XIII of FIG. 10.
Figure 14:
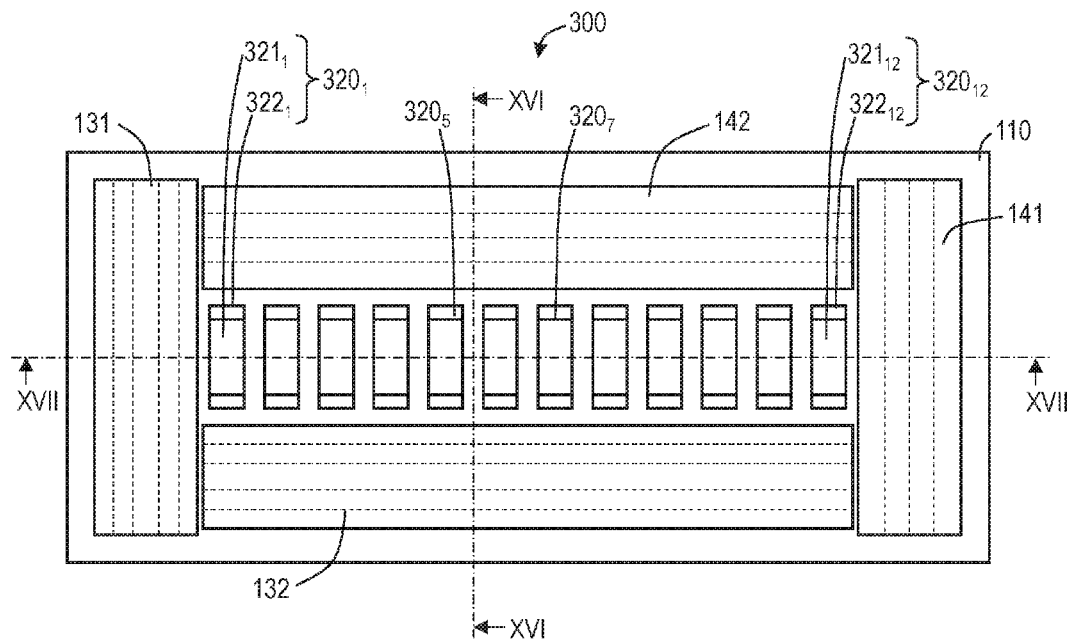
FIG. 14 is a planar view illustrating a second connector of the connector assembly according to the second embodiment.
Figure 15:
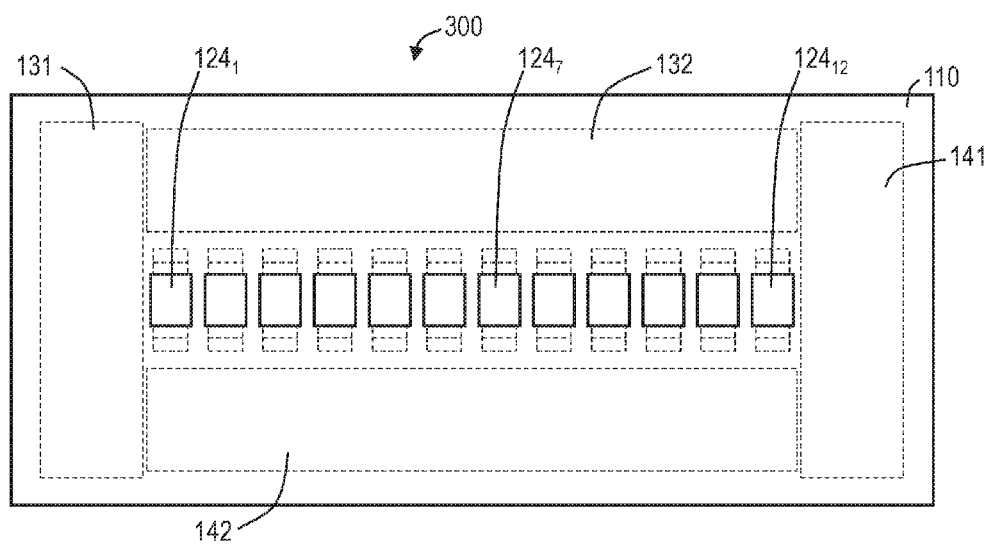
FIG. 15 is a rear view illustrating the second connector of the connector assembly according to the second embodiment.
Figure 16:
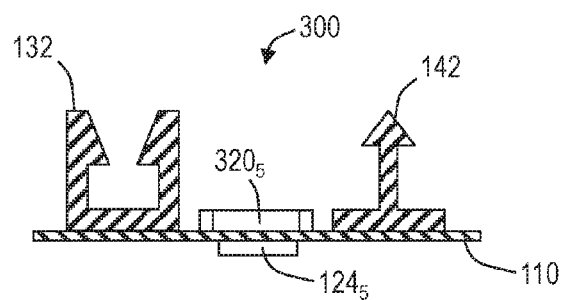
FIG. 16 is a sectional view taken along the line XVI-XVI of FIG. 14.
Figure 17:
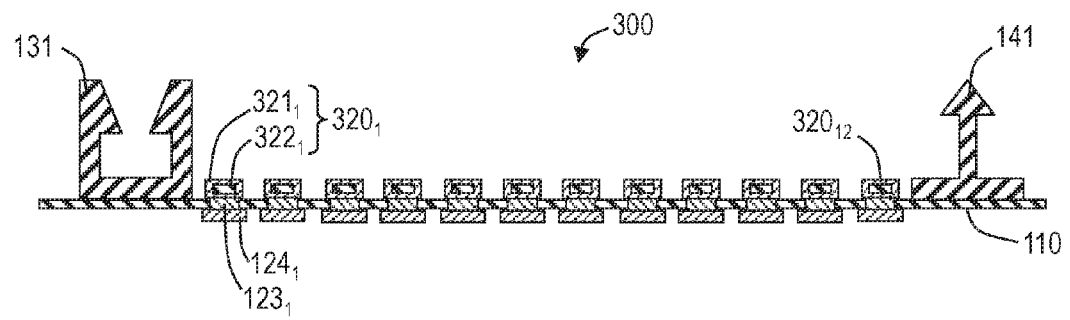
FIG. 17 is a sectional view taken along the line XVII-XVII of FIG. 14.
Figure 18:
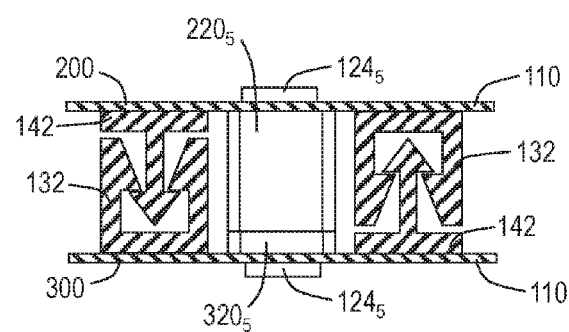
FIG. 18 is a sectional view on the XVI-XVI position of FIG. 14 in a case where fasteners of the first connector and fasteners of the second connector, which are respectively opposed to each other, of the connector assembly according to the second embodiment are respectively engaged with each other.
Figure 19:
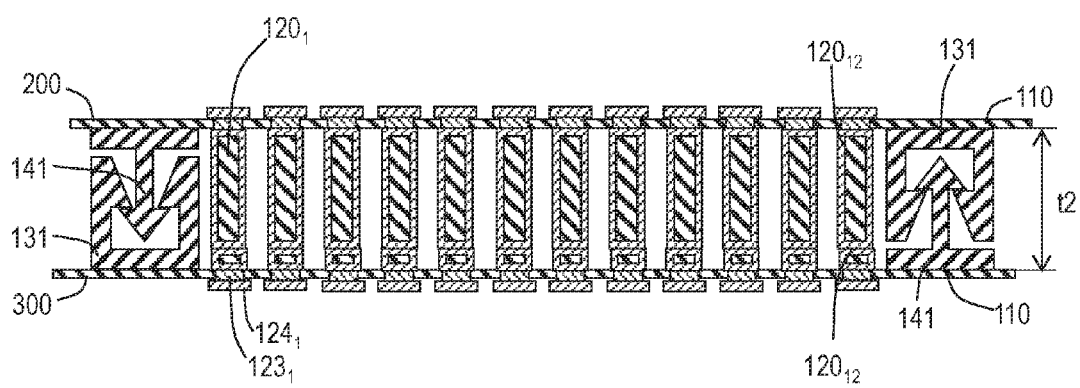
FIG. 19 is a sectional view on the XVII-XVII position of FIG. 14 in a case where the fasteners of the first connector and the fasteners of the second connector, which are respectively opposed to each other, of the connector assembly according to the second embodiment are respectively engaged with each other.
Figure 20:
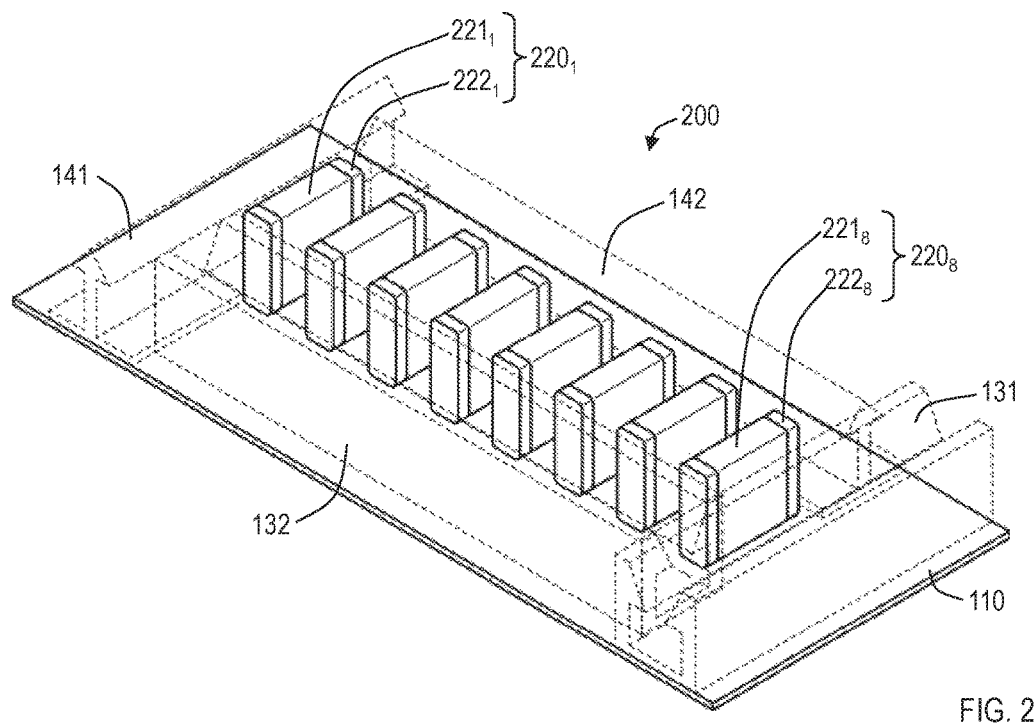
FIG. 20 is a perspective view illustrating the first connector of the connector assembly according to the second embodiment.
Figure 21:
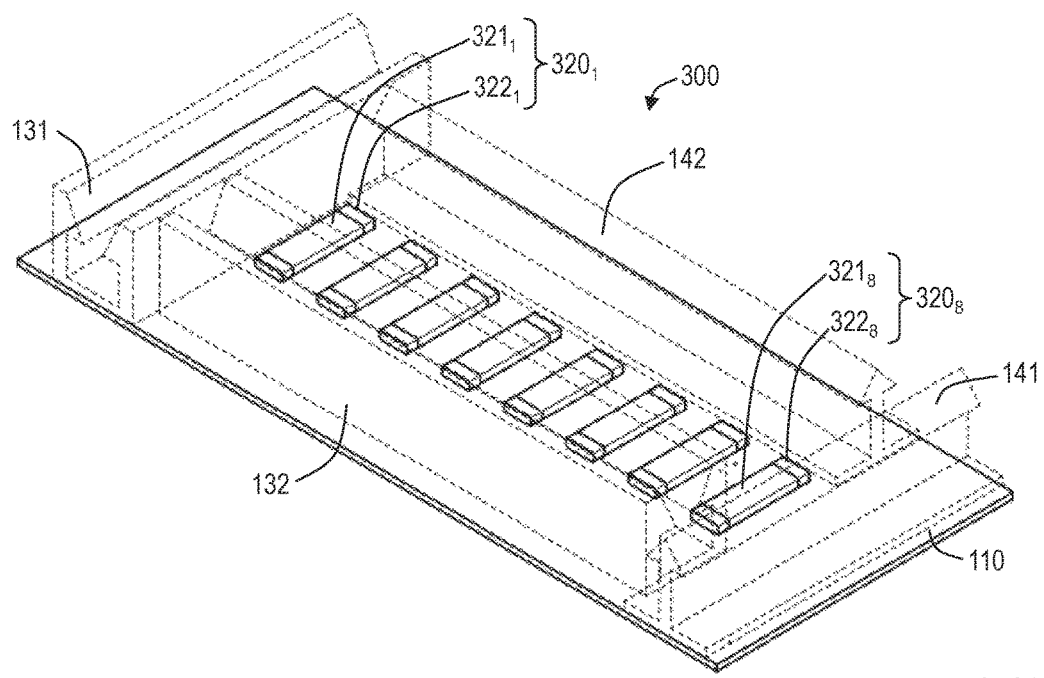
FIG. 21 is a perspective view illustrating the second connector of the connector assembly according to the second embodiment.

FIG. 10 is a planar view illustrating a first connector of a connector assembly according to a second embodiment. FIG. 11 is a rear view illustrating the first connector of the connector assembly according to the second embodiment. FIG. 12 is a sectional view taken along the line XII-XII of FIG. 10. FIG. 13 is a sectional view taken along the line XIII-XIII of FIG. 10. FIG. 14 is a planar view illustrating a second connector of the connector assembly according to the second embodiment. FIG. 15 is a rear view illustrating the second connector of the connector assembly according to the second embodiment. FIG. 16 is a sectional view taken along the line XVI-XVI of FIG. 14. FIG. 17 is a sectional view taken along the line XVII-XVII of FIG. 14. FIG. 18 is a sectional view on the XVI-XVI position of FIG. 14 in a case where fasteners of the first connector and fasteners of the second connector, which are respectively opposed to each other, of the connector assembly according to the second embodiment are respectively engaged with each other (the second connector is illustrated on the lower side). FIG. 19 is a sectional view on the XVII-XVII position of FIG. 14 in a case where the fasteners of the first connector and the fasteners of the second connector, which are respectively opposed to each other, of the connector assembly according to the second embodiment are respectively engaged with each other (the second connector is illustrated on the lower side). FIG. 20 is a perspective view illustrating the first connector of the connector assembly according to the second embodiment, and FIG. 21 is a perspective view illustrating the second connector of the connector assembly according to the second embodiment. In FIG. 20 and FIG. 21, fasteners 131, 132, 141, and 142 are drawn by dotted lines so as to facilitate understanding of the whole shape and accordingly, parts actually concealed by the fasteners 131, 132, 141, and 142 are also illustrated. Further, FIGS. 10 to 19 illustrate an example in which twelve pieces of first electrical connection members and twelve pieces of second electrical connection members are provided, while FIG. 20 and FIG. 21 illustrate an example in which eight pieces of first electrical connection members and eight pieces of second electrical connection members are provided. As is the case with the first embodiment, the number of the first electrical connection members and the number of the second electrical connection members do not have to be limited and may be determined in accordance with the application.

The connector assembly according to the second embodiment includes a first connector 200 which has first electrical connection members $220_1, \ldots, 220_{12}$ arranged on a base material 110 made of resin and a second connector 300 which has second electrical connection members $320_1, \ldots, 320_{12}$ on positions respectively opposed to the first electrical connection members $220_1, \ldots, 220_{12}$ on a base material 110 made of resin. The first connector 200 and the second connector 300 further include the fasteners 131, 132, 141, and 142 which are made of resin, are engageable, and are integrated with respectively-corresponding base materials 110, on mutually-opposed positions. The fasteners 131, 132, 141, and 142 of the first connector 200 form a polygonal shape which surrounds the first electrical connection members $220_1, \ldots, 220_{12}$ and the fasteners 131, 132, 141, and 142 of the second connector 300 form a polygonal shape which surrounds the second electrical connection members $320_1, \ldots, 320_{12}$. The fasteners 131, 132, 141, and 142 have water-tightness when they are engaged with corresponding fasteners. By engaging the fasteners 131, 132, 141, and 142 of the first connector 200 and the fasteners 141, 142, 131, and 132 of the second connector 300 which are respectively opposed to each other, the first electrical connection members $220_1, \ldots, 220_{12}$ and the second electrical connection members $320_1, \ldots, 320_{12}$ are respectively brought into contact with each other. FIGS. 10 to 21 illustrate a case where the fasteners form a rectangular shape. However, the fasteners may form another polygonal shape such as a hexagonal shape. Further, in FIGS. 10 to 21, both of inner sides of the fasteners (sides closer to the first electrical connection members $220_1, \ldots, 220_{12}$) and outer sides form rectangular shapes. However, in a case where the fasteners form another polygonal shape, it is sufficient that the inner sides of the fasteners form the polygonal shape, and the outer sides of the fasteners do not have to be brought into contact with each other. The base material 110 and the fasteners 131, 132, 141, and 142 are same as those of the first embodiment. Further, the seal members 150 and water repellent treatment among the fasteners 131, 132, 141, and 142 are same as those of the first embodiment.

The first electrical connection members $220_1, \ldots, 220_{12}$ have the configuration in which conductors $221_1, \ldots, 221_{12}$ are bonded around elastic members $222_1, \ldots, 222_{12}$ respectively. The second electrical connection members $320_1, \ldots, 320_{12}$ may have the configuration in which conductors $321_1, \ldots, 321_{12}$ are bonded around elastic members $322_1, \ldots, 322_{12}$ respectively or the configuration in which the conductors $321_1, \ldots, 321_{12}$ are made of copper plates or the like without using elastic members. A material of the elastic members $222_1, \ldots, 222_{12}$ is the same as that in the first embodiment. Further, the conductors $221_1, \ldots, 221_{12}$ and the conductors $321_1, \ldots, 321_{12}$ may be made of copper films, for example. Through conductive portions $123_1, 123_{12}$ and conductors $124_1, \ldots, 124_{12}$ are the same as those in the first embodiment.

For example, the height, the width (the longer direction in the planar view of FIG. 10), and the thickness (the shorter direction in the planar view of FIG. 10) of the first electrical connection members $220_1, \ldots, 220_{12}$ may be respectively set to approximately 1.6 mm, approximately 3 mm, and approximately 1 mm, and the interval among the first electrical connection members $220_1, \ldots, 220_{12}$ may be set to approximately 1 mm. The height, the width (the longer direction in the planar view of FIG. 14), and the thickness (the shorter direction in the planar view of FIG. 14) of the second electrical connection members $320_1, \ldots, 320_{12}$ may be respectively set to approximately 0.2 mm, approximately 3 mm, and approximately 1 mm, and the interval among the second electrical connection members $320_1, \ldots, 320_{12}$ may be set to approximately 1 mm. An interval between the base materials 110 in a state that the fasteners 131, 132, 141, and 142 are respectively engaged with corresponding fasteners may be set to approximately 1.7 mm. In the state of engagement, the elastic members $222_1, \ldots, 222_{12}$ of the first electrical connection members $220_1, \ldots, 220_{12}$ deform and thus the first electrical connection members $220_1, \ldots, 220_{12}$ and the second electrical connection members $320_1, \ldots, 320_{12}$ are in contact with each other in a manner to push against each other. The height of the first electrical connection members $220_1, \ldots, 220_{12}$ may be set as appropriate based on a mutual pushing force required in engagement, an elastic modulus of the elastic members $222_1, \ldots, 222_{12}$, and the like. That is, at least the first electrical connection members $220_1, \ldots, 220_{12}$ have elasticity in the normal direction of the base material 110.

The connector assembly according to the second embodiment has the configuration as that described above, being able to exhibit a similar advantageous effect to that of the connector assembly according to the first embodiment.

Third Embodiment

Figure 22:
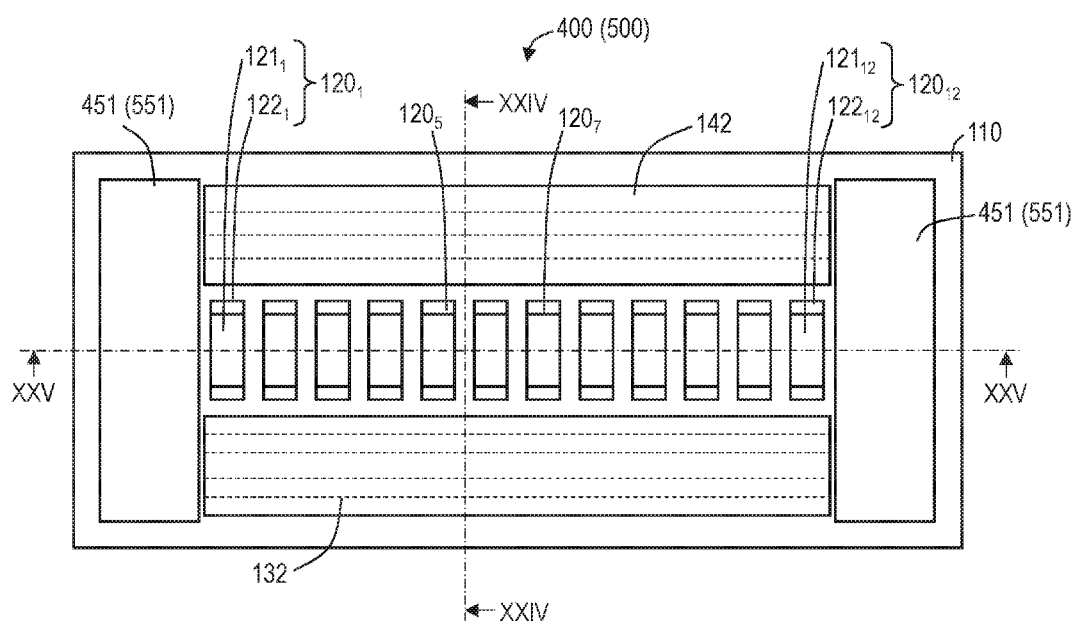
FIG. 22 is a planar view illustrating a first connector of a connector assembly according to the third embodiment and a first modification related to the third embodiment.
Figure 23:
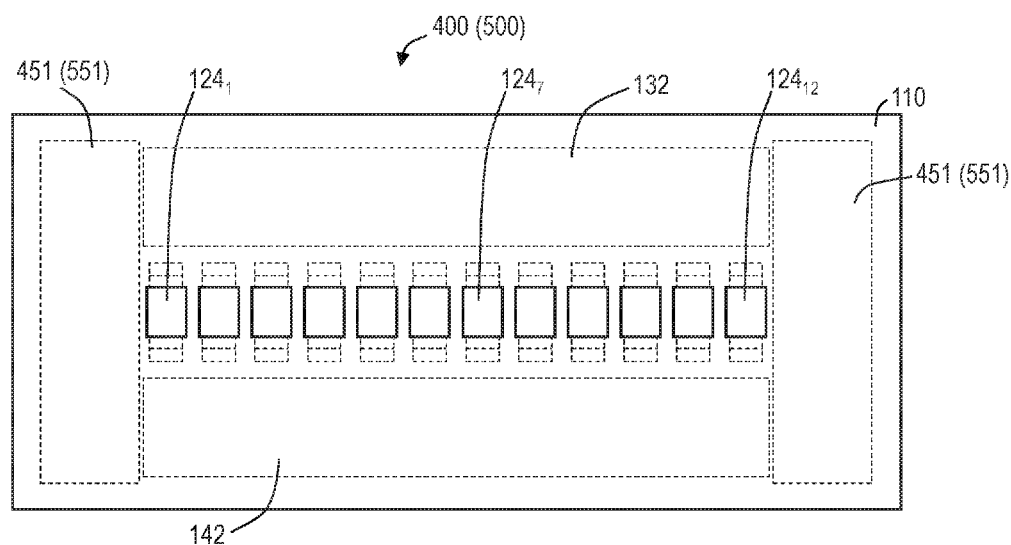
FIG. 23 is a rear view illustrating the first connector of the connector assembly according to the third embodiment and the first modification related to the third embodiment.

FIG. 22 is a planar view illustrating a first connector of a connector assembly according to a third embodiment. FIG. 23 is a rear view illustrating the first connector of the connector assembly according to the third embodiment. FIG.

Figure 24:
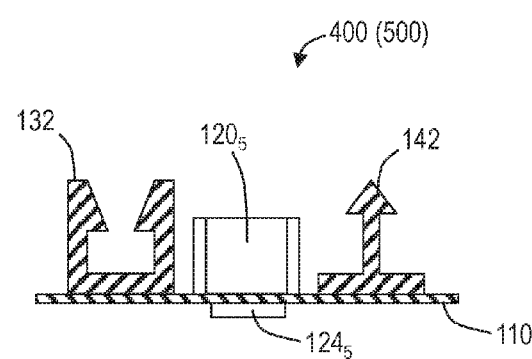
FIG. 24 is a sectional view taken along the line XXIV-XXIV of FIG. 22.
Figure 25:
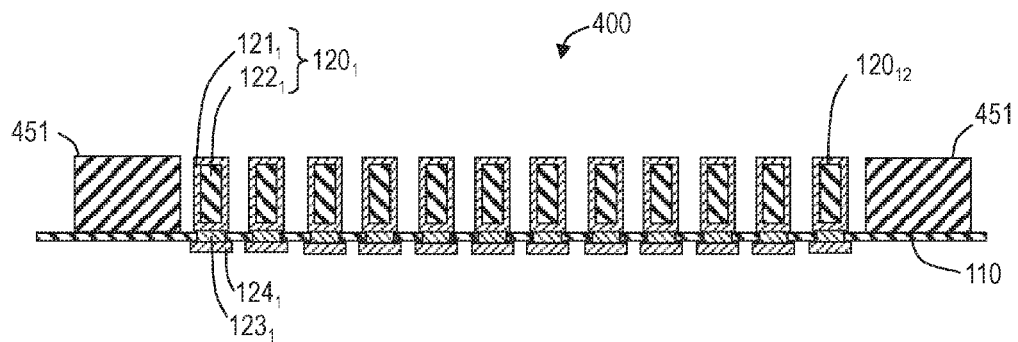
FIG. 25 is a sectional view taken along the line XXV-XXV of FIG. 22 in the case of the third embodiment.
Figure 26:
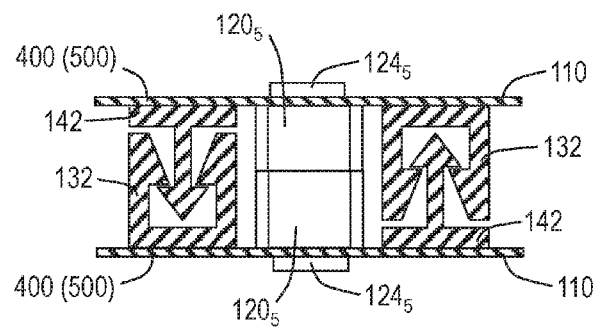
FIG. 26 is a sectional view on the XXIV-XXIV position of FIG. 22 in a case where fasteners of the first connector and fasteners of a second connector, which are respectively opposed to each other, of the connector assembly according to the third embodiment and the first modification related to the third embodiment are respectively engaged with each other.
Figure 27:
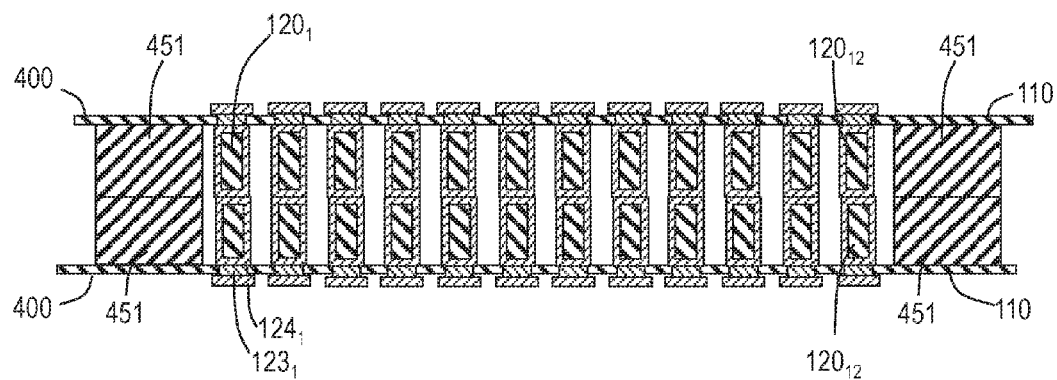
FIG. 27 is a sectional view on the XXV-XXV position of FIG. 22 in a case where the fasteners of the first connector and the fasteners of the second connector, which are respectively opposed to each other, of the connector assembly according to the third embodiment are respectively engaged with each other.

24 is a sectional view taken along the line XXIV-XXIV of FIG. 22. FIG. 25 is a sectional view taken along the line XXV-XXV of FIG. 22. FIG. 26 is a sectional view on the XXIV-XXIV position of FIG. 22 in a case where fasteners of the first connector and fasteners of a second connector, which are respectively opposed to each other, of the connector assembly according to the third embodiment are respectively engaged with each other. FIG. 27 is a sectional view on the XXV-XXV position of FIG. 22 in a case where the fasteners of the first connector and the fasteners of the second connector, which are respectively opposed to each other, of the connector assembly according to the third embodiment are respectively engaged with each other. In the third embodiment, the configuration of a first connector 400 and the configuration of a second connector 400 are the same as each other. Further, FIGS. 22 to 27 illustrate an example in which twelve pieces of first electrical connection members are provided. However, the number of the first electrical connection members and the number of second electrical connection members do not have to be limited and may be determined in accordance with the application.

The connector assembly according to the third embodiment includes the first connector 400 which has first electrical connection members $120_1$, . . . , $120_{12}$ arranged on a base material 110 made of resin and the second connector 400 which has second electrical connection members $120_1$, $120_{12}$ on positions respectively opposed to the first electrical connection members $120_1$, . . . , $120_{12}$ on a base material 110 made of resin. The first connector 400 and the second connector 400 further include the fasteners 132 and 142 which are made of resin, are engageable, and are integrated with respectively-corresponding base materials 110, on mutually-opposed positions. Each of the first connector 400 and the second connector 400 further includes seal portions 451 made of a seal member on mutually-opposed positions. The fasteners 132 and 142 and the seal portions 451 of the first connector 400 surround the first electrical connection members $120_1$, . . . , $120_{12}$ and the fasteners 132 and 142 and the seal portions 451 of the second connector 400 surround the second electrical connection members $120_1$, $120_{12}$.

The fasteners 132 and 142 have water-tightness when they are engaged with each other. By engaging the fasteners 132 and 142 of the first connector 400 and the fasteners 142 and 132 of the second connector 400 which are respectively opposed to each other, the first electrical connection members $120_1$, . . . , $120_{12}$ and the second electrical connection members $120_1$, . . . , $120_{12}$ are brought into contact with each other and the seal portions 451 are brought into contact with each other. In FIGS. 22 to 27, the fasteners 132 and 142 and the seal portions 451 form a rectangular shape and surround the first electrical connection members $120_1$, . . . , $120_{12}$. However, the fasteners and the seal portions may form another shape. For example, the fasteners and the seal portions may form a hexagonal shape or an octagonal shape, and the seal portion 451 may be formed to be curved. The seal portion 451 may have concavities and convexities though contacting parts are flat in FIG. 25 and FIG. 27. Further, the seal portion 451 has elasticity.

The base material 110 and the fasteners 132 and 142 are the same as those in the first embodiment. Further, the first electrical connection members $120_1$, . . . , $120_{12}$, the second electrical connection members $120_1$, . . . , $120_{12}$, through conductive portions $123_1$, . . . , $123_{12}$, and conductors $124_1$, . . . , $124_{12}$ are also the same as those in the first embodiment.

The connector assembly according to the third embodiment has the configuration as that described above, being able to exhibit a similar advantageous effect to that of the connector assembly according to the first embodiment.

First Modification

Figure 28:
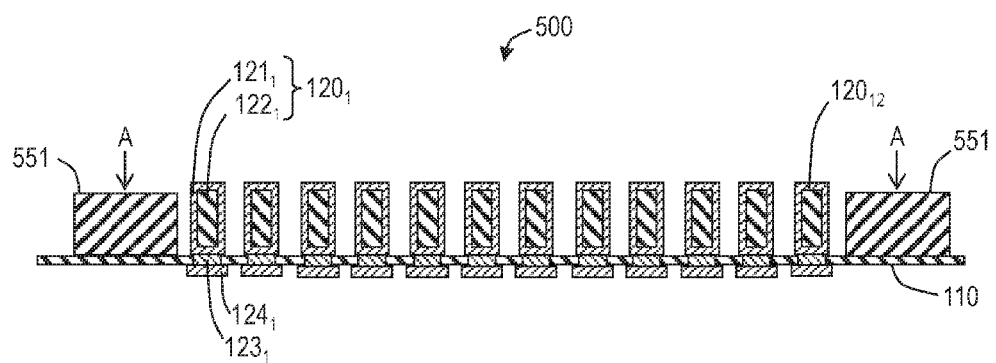
FIG. 28 is a sectional view taken along the line XXV-XXV of FIG. 22 in the case of the first modification related to the third embodiment.
Figure 29:
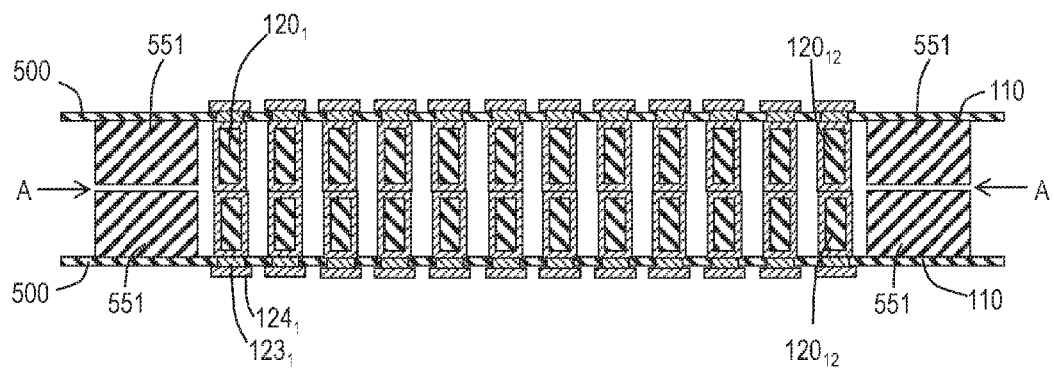
FIG. 29 is a sectional view on the XXV-XXV position of FIG. 22 in a case where the fasteners of the first connector and the fasteners of the second connector, which are respectively opposed to each other, of the connector assembly according to the first modification related to the third embodiment are respectively engaged with each other.

In this modification, an example in which the seal portions in the third embodiment are changed into water repellent treatment portions is described. FIG. 22 is a planar view illustrating a first connector of a connector assembly according to the present modification. FIG. 23 is a rear view illustrating the first connector of the connector assembly according to the present modification. FIG. 24 is a sectional view taken along the line XXIV-XXIV of FIG. 22. FIG. 28 is a sectional view taken along the line XXV-XXV of FIG. 22. FIG. 26 is a sectional view on the XXIV-XXIV position of FIG. 22 in a case where fasteners of the first connector and fasteners of a second connector, which are respectively opposed to each other, of the connector assembly according to the present modification are respectively engaged with each other. FIG. 29 is a sectional view on the XXV-XXV position of FIG. 22 in a case where the fasteners of the first connector and the fasteners of the second connector, which are respectively opposed to each other, of the connector assembly according to the present modification are respectively engaged with each other. In the present modification, the configuration of a first connector 500 and the configuration of a second connector 500 are the same as each other. Further, FIGS. 22 to 24, 26, 28, and 29 illustrate an example in which twelve pieces of first electrical connection members are provided. However, the number of the first electrical connection members and the number of the second electrical connection members do not have to be limited and may be determined in accordance with the application.

The connector assembly according to the present modification includes the first connector 500 which has first electrical connection members $120_1$, . . . , $120_{12}$ arranged on a base material 110 made of resin and the second connector 500 which has second electrical connection members $120_1$, . . . , $120_{12}$ on positions respectively opposed to the first electrical connection members $120_1$, . . . , $120_{12}$ on a base material 110 made of resin. The first connector 500 and the second connector 500 further include the fasteners 132 and 142 which are made of resin, are engageable, and are integrated with respectively-corresponding base materials 110, on mutually-opposed positions. Each of the first connector 500 and the second connector 500 further includes water repellent treatment portions 551 made of a member subjected to the water repellent treatment on mutually-opposed positions. The fasteners 132 and 142 and the water repellent treatment portions 551 of the first connector 500 surround the first electrical connection members $120_1$, . . . , $120_{12}$ and the fasteners 132 and 142 and the water repellent treatment portions 551 of the second connector 500 surround the second electrical connection members $120_1$, . . . , $120_{12}$.

The fasteners 132 and 142 have water-tightness when they are engaged with each other. By engaging the fasteners 132 and 142 of the first connector 500 and the fasteners 142 and 132 of the second connector 500 which are respectively opposed to each other, the first electrical connection members $120_1$, . . . , $120_{12}$ and the second electrical connection members $120_1$, . . . , $120_{12}$ are respectively brought into contact with each other and the water repellent treatment portions 551 mutually approach to have an interval, from which water does not infiltrate within a predetermined atmospheric pressure (for example, 2 atmospheres), or a smaller interval. In FIGS. 22 to 24, 26, 28, and 29, the fasteners 132 and 142 and the water repellent treatment portions 551 form a rectangular shape and surround the first electrical connection members $120_1, \ldots, 120_{12}$. However, the fasteners and the water repellent treatment portions may form another shape. For example, the fasteners and the water repellent treatment portions may form a hexagonal shape or an octagonal shape, and the water repellent treatment portion 551 may be formed to be curved. The water repellent treatment portions 551 may be formed such that water repellent treatment is applied to at least mutually opposed parts (a part denoted with A in FIG. 28). By such water repellent treatment, water infiltration from a gap denoted with A of FIG. 29 can be prevented.

The base material 110 and the fasteners 132 and 142 are the same as those in the first embodiment. Further, the first electrical connection members $120_1, \ldots, 120_{12}$, the second electrical connection members $120_1, 120_{12}$, through conductive portions $123_1, \ldots, 123_{12}$, and conductors $124_1, \ldots, 124_{12}$ are also the same as those in the first embodiment.

The connector assembly according to the present modification has the configuration as that described above, being able to exhibit a similar advantageous effect to that of the connector assembly according to the first embodiment.

Second Modification

In this modification, modifications of the first electrical connection members and the second electrical connection members will be described. This modification is applicable to any of the first embodiment, the second embodiment, the third embodiment, and the first modification related to the third embodiment. Only one or both of the first electrical connection members and the second electrical connection members may be changed into electrical connection members which will be described below. Therefore, description will be provided below while referring to the first electrical connection member and/or the second electrical connection member merely as an "electrical connection member".

Figure 30:
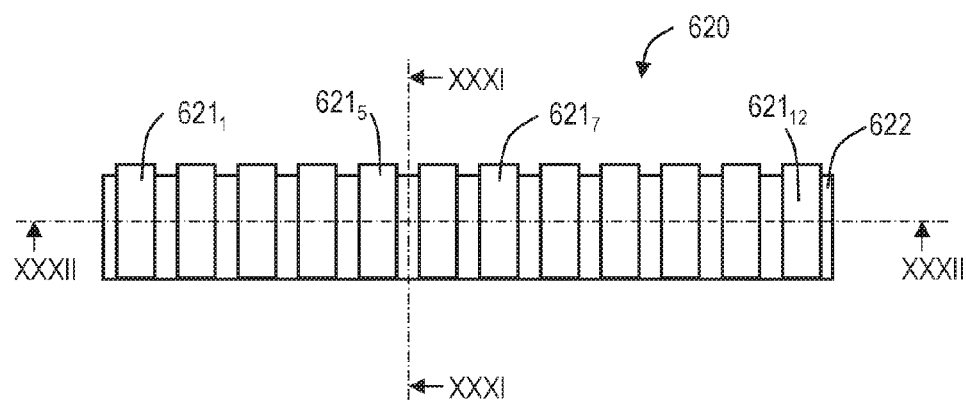
FIG. 30 is a planar view illustrating electrical connection members.
Figure 31:
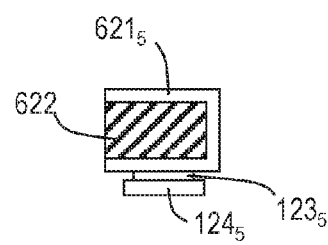
FIG. 31 is a sectional view taken along the line XXXI-XXXI of FIG. 30 and including a through conductive portion and a conductor on a rear face.
Figure 32:
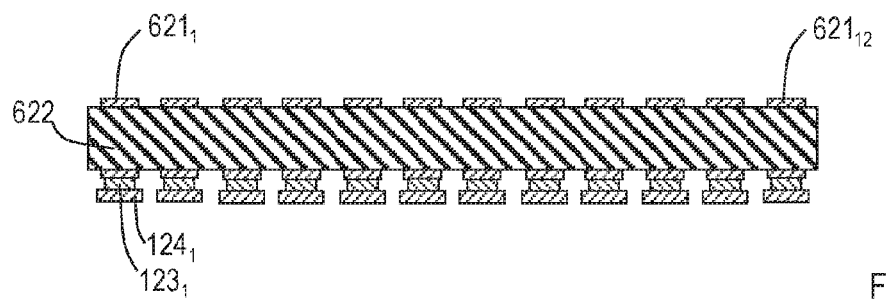
FIG. 32 is a sectional view taken along the line XXXII-XXXII of FIG. 30 and including through conductive portions and conductors on the rear face.

FIG. 30 is a planar view illustrating an electrical connection member (drawing viewed from the same direction as FIG. 2). FIG. 31 is a sectional view taken along the line XXXI-XXXI of FIG. 30 and including a through conductive portion and a conductor on a rear face. FIG. 32 is a sectional view taken along the line XXXII-XXXII of FIG. 30 and including through conductive portions and conductors on the rear face. An electrical connection member 620 has the configuration in which conductors $621_1, \ldots, 621_{12}$ are formed around an elastic member 622. The conductors $621_1, \ldots, 621_{12}$ are respectively connected to conductors $124_1, \ldots, 124_{12}$ which are arranged on a rear face of a base material 110 respectively via through conductive portions $123_1, \ldots, 123_{12}$. The same material as that in the first embodiment may be used for the elastic member 622. The conductors $621_1, \ldots, 621_{12}$ may be made of copper films or formed by performing etching after forming a thin film on the elastic member 622 by a method such as vapor deposition, sputtering, and plating.

The electrical connection member described in the present modification has the configuration as that described above, being applicable to any of the first embodiment, the second embodiment, the third embodiment, and the first modification related to the third embodiment.

The foregoing description of the embodiments of the invention has been presented for the purpose of illustration and description. It is not intended to be exhaustive and to limit the invention to the precise form disclosed. Modifications or variations are possible in light of the above teaching. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A connector assembly comprising:
   a first connector that has first electrical connection members located on a resin base material; and
   a second connector that has second electrical connection members at positions respectively opposed to the first electrical connection members located on a resin base material; wherein
   the resin base material of the first and second connectors each include flexible portions,
   the first electrical connection members directly contacting flexible portions of the resin base material of the first connector,
   the second electrical connection members directly contacting flexible portions of the resin base material of the second connector,
   the first connector and the second connector further have locking resin fasteners that are respectively engageable with each other, and are integrated with the respective resin base materials, on mutually-opposed positions,
   the locking resin fasteners of the first connector extend so as to form a polygonal shape surrounding the first electrical connection members,
   the locking resin fasteners of the second connector extend so as to form a polygonal shape surrounding the second electrical connection members,
   the locking resin fasteners which are opposed to each other on the mutually opposed positions have water-tightness when the fasteners are engaged with each other, and
   the first electrical connection members and the second electrical connection members are respectively brought into contact with each other by engaging the locking resin fasteners which are respectively opposed to each other.

2. The connector assembly according to claim 1, wherein
   the first connector and the second connector further include seal members in a gap between adjacent fasteners, and
   the seal members on the first connector and the seal members on the second connector are respectively brought into contact with each other by engaging the fasteners which are opposed to each other.

3. The connector assembly according to claim 1, wherein a gap between adjacent fasteners in the first connector and in the second connector includes a water repellant treatment.

4. The connector assembly according to claim 1, wherein at least one of the first electrical connection members and the second electrical connection members has elasticity in a normal direction of the base material.

5. The connector assembly according to claim 1, wherein the polygonal shape is a rectangular shape.

6. The connector assembly according to claim 4, wherein the first connector and the second connector have a same shape as each other.

7. The connector assembly according to claim 5, wherein the first connector and the second connector have a same shape as each other.

8. The connector assembly according to claim 1, wherein the base material and the fasteners are integrated with each other through thermal fusion.

9. The connector assembly according to claim 1, upon the first electrical connection members and the second electrical connection members coming into contact with each other, the locking resin fasteners of the first connector and the locking resin fasteners of the second connector lockingly and resiliently engage with each other.

10. A connector assembly comprising:
a first connector that has first electrical connection members located on a resin base material; and
a second connector that has second electrical connection members at positions respectively opposed to the first electrical connection members located on a resin base material; wherein
the resin base material of the first and second connectors each include flexible portions,
the first electrical connection members directly contacting flexible portions of the resin base material of the first connector,
the second electrical connection members directly contacting flexible portions of the resin base material of the second connector,
the first connector and the second connector further have locking resin fasteners that are respectively engageable with each other and that are integrated with the respective resin base materials, on mutually-opposed positions, and
seal portions of seal members are on mutually-opposed positions,
the locking resin fasteners and the seal portions of the first connector extend so as to surround the first electrical connection members,
the locking resin fasteners and the seal portions of the second connector extend so as to surround the second electrical connection members,
the locking resin fasteners which are opposed to each other on the mutually opposed portions have water-tightness when the fasteners are engaged with each other, and
the first electrical connection members and the second electrical connection members are respectively brought into contact with each other and the seal portions on the first connector and the seal portions on the second connector are brought into contact with each other by engaging the locking resin fasteners which are respectively opposed to each other.

11. The connector assembly according to claim 10, wherein at least one of the first electrical connection members and the second electrical connection members has elasticity in a normal direction of the base material.

12. The connector assembly according to claim 11, wherein the first connector and the second connector have a same shape as each other.

13. The connector assembly according to claim 10, wherein the polygonal shape is a rectangular shape.

14. The connector assembly according to claim 13, wherein the first connector and the second connector have a same shape as each other.

15. The connector assembly according to claim 10, upon the first electrical connection members and the second electrical connection members coming into contact with each other, the locking resin fasteners of the first connector and the locking resin fasteners of the second connector lockingly and resiliently engage with each other.

16. A connector assembly comprising:
a first connector that has first electrical connection members located on a resin base material; and
a second connector that has second electrical connection members at positions respectively opposed to the first electrical connection members located on a resin base material; wherein
the resin base material of the first and second connectors each include flexible portions,
the first electrical connection members directly contacting flexible portions of the resin base material of the first connector,
the second electrical connection members directly contacting flexible portions of the resin base material of the second connector,
the first connector and the second connector further have locking resin fasteners which, are respectively engageable with each other, and that are integrated with the respective resin base materials, on mutually-opposed positions, and
water repellent treatment portions of water repellant treatment members subjected to water repellent treatment are on mutually-opposed positions,
the locking resin fasteners and the water repellent treatment portions of the first connector extend so as to surround the first electrical connection members,
the locking resin fasteners and the water repellent treatment portions of the second connector extend so as to surround the second electrical connection members,
the locking resin fasteners which are opposed to each other on the mutually opposed positions have water-tightness when the fasteners are engaged with each other, and
the first electrical connection members and the second electrical connection members are respectively brought into contact with each other and the water repellent treatment portions on the first connector and the water repellent treatment portions on the second connector mutually approach to have an interval, from which water does not infiltrate within a predetermined atmospheric pressure, or a smaller interval, by engaging the locking resin fasteners which are respectively opposed to each other.

17. The connector assembly according to claim 16, wherein at least one of the first electrical connection members and the second electrical connection members has elasticity in a normal direction of the base material.

18. The connector assembly according to claim 17, wherein the first connector and the second connector have a same shape as each other.

19. The connector assembly according to claim 16, wherein the polygonal shape is a rectangular shape.

20. The connector assembly according to claim 19, wherein the first connector and the second connector have a same shape as each other.

* * * * *